United States Patent [19]

Collins et al.

[11] Patent Number: 5,350,479
[45] Date of Patent: Sep. 27, 1994

[54] ELECTROSTATIC CHUCK FOR HIGH POWER PLASMA PROCESSING

[75] Inventors: Kenneth S. Collins; John R. Trow, both of San Jose; Joshua C. W. Tsui, Santa Clara; Craig A. Roderick, San Jose; Nicolas J. Bright, Saratoga; Jeffrey Marks, San Jose, all of Calif.; Tetsuya Ishikawa, Funabashi, Japan

[73] Assignee: Applied Materials, Inc., Santa Clara, Calif.

[21] Appl. No.: 984,797

[22] Filed: Dec. 2, 1992

[51] Int. Cl.$^5$ ............................................. H01L 21/68
[52] U.S. Cl. ....................................... 156/345; 279/128
[58] Field of Search ......................... 279/128; 156/345; 361/234

[56] References Cited

U.S. PATENT DOCUMENTS

| | | | |
|---|---|---|---|
| 4,565,601 | 1/1986 | Kakehi | 156/626 |
| 4,645,218 | 2/1987 | Ooshio | 361/234 |
| 4,771,730 | 9/1988 | Tezuka | 156/345 |
| 5,055,964 | 10/1991 | Logan | 361/234 |
| 5,103,367 | 4/1992 | Horwitz | 361/234 |
| 5,151,845 | 9/1992 | Watanabe | 361/234 |

*Primary Examiner*—Richard Bueker
*Attorney, Agent, or Firm*—Eric L. Prahl

[57] ABSTRACT

An electrostatic chuck for holding an article to be processed in a plasma reaction chamber and comprising a metal pedestal coated with a layer of dielectric material in which is formed a cooling gas distribution system for passing and distributing a cooling gas between the upper surface of the layer and the article when supported on the pedestal. The gas distribution system comprises a plurality of intersecting grooves formed entirely in the upper surface of the layer with small gas distribution holes through intersections of the grooves over upper ends of cooling gas receiving holes formed in an underside of the pedestal.

32 Claims, 5 Drawing Sheets

ELECTROSTATIC CHUCK FOR HIGH POWER PLASMA PROCESSING

FIELD OF THE INVENTION

The present invention relates to an electrostatic chuck ("E-chuck") for high density plasma processing of articles such as semiconductor wafers. The E-chuck overcomes the difficulties present with prior art mechanical and electrostatic chucks in high density plasma processing applications and is particularly well suited to processes in which the article may be RF biased for enhanced process performance in a high density plasma process, such as that used in $SiO_2$ etching. The E-chuck addresses the requirements of uniform coupling of electrical and thermal energy in a hostile electrical, thermal and chemical environment.

BACKGROUND OF THE INVENTION

In the plasma processing of articles such as semiconductor wafers, a common problem is the coupling of electrical energy to the article being processed. Typically, electromagnetic coupling of RF energy into the "source" region of a plasma chamber is employed to generate and maintain a high electron density plasma having a low particle energy. In addition, RF "bias" energy is usually capacitively coupled in the plasma via the article being processed to increase and control the energy of ions impinging on the article.

In a typical high density plasma reactor, the driving point RF "bias" impedance presented by the plasma is very low. To achieve uniform ion energy and flux to the article being processed (typically essential for etching or other plasma processes), uniform coupling of RF "bias" energy through the article being processed to the plasma is required. The article being processed typically is held against some kind of chuck and RF bias energy is applied to the chuck. What is desired is a constant plasma sheath voltage across the surface of the article being processed.

The degree to which such a uniform plasma sheath voltage can be achieved is a function not only of the plasma density uniformity as generated by the plasma source, but is also a function of the impedance per unit area of the plasma sheath adjacent to the article, the impedance per unit area of the article, the impedance per unit area of any gap between the article and the chuck and the impedance per unit area of the chuck.

Besides electrical coupling, the chuck should be tightly thermally coupled to the article being processed. Typically the temperature of the article is a process parameter to be controlled and this normally means removing heat from or adding heat to the article during processing. Heat transfer in a low pressure or vacuum environment such as that used for plasma processing is generally poor. Some means of providing for adequate heat transfer between the article being processed and adjacent surfaces is usually necessary.

Typical prior art chucks mechanically clamp an article to the chuck with a clamp ring applying a holding force at the periphery of the article. The thermal contact between article and chuck is generally insufficient to accommodate the heat load imposed by the plasma on the article. Without some means of improved thermal contact between article and chuck, the temperature of the article may rise out of acceptable limits.

Gas is typically introduced between the article and chuck to enhance thermal contact and heat transfer from the article to the chuck. The gas pressure required is a function of the heat load imposed by the plasma, the desired maximum article temperature, the temperature at which the chuck can be maintained (such as with liquid cooling), the choice of cooling gas and the article/gas and gas/chuck accommodation coefficients (measures of how effectively heat is transferred between a gas and a surface). For biased high density plasma applications, helium gas is used as the cooling gas and the gas pressure required is typically in the 5 to 30 torr range.

For "low pressure" plasma processes (those operating in millitorr pressure range), some means must be provided to allow a significantly higher pressure in the region between the article and chuck with respect to the ambient pressure in the process chamber. In addition, a leak of cooling gas into the process environment may produce undesirable results. Typically some kind of seal, usually an elastomer, is used to allow maintenance of the pressure difference between the two regions.

If the article to be processed is simply mechanically clamped at its periphery to the chuck, and gas introduced between article and chuck, the article will bow away from the chuck due to the pressure difference across the article. If a flat chuck is used on a disk shaped article, a large gap results between the article and the chuck with a peak gap at the center. Under such conditions, thermal and electrical coupling between the article and the chuck are non-uniform. Mechanically clamped chucks typically pre-compensate such article-bowing by attempting to match the chuck's surface to the curvature of the article under stress. Theoretically, this can be done for simply shaped articles (such as disks), but the presence of discontinuities or complex shapes make analytical precompensation impossible, and. trial-and-error is required. Mismatches in curvatures between the article and the chuck result in a variable gap between such surfaces, resulting in non uniform electrical and thermal coupling.

Electrostatic chucks have been proposed to overcome the non-uniform coupling associated with mechanical chucks. Electrostatic chucks employ the attractive coulomb force between oppositely charged surfaces to clamp together an article and a chuck. In principle, with an electrostatic chuck, the force between article and chuck is uniform for a flat article and flat chuck. The electrostatic force between the article and the chuck is proportional to the square of the voltage between them, proportional to the relative permittivity of the dielectric medium separating them (assuming conductivity is negligible) and inversely proportional with the square of the distance between them. Typically for biased-article high density plasma processing applications (such as $SiO_2$ etching) a cooling gas is required to improve the heat transfer between article and chuck to acceptable levels. Introduction of gas cooling between article and chuck, while required to achieve adequate heat transfer, causes problems with prior art electrostatic chucks when used in biased-article high density plasma applications.

In particular, the requirement of introducing cooling gas in the region between article and chuck requires that some discontinuity be introduced in the chuck surface, typically some type of hole(s) through the chuck to a gas passage behind the surface. The introduction of any discontinuity in the chuck surface distorts the electric field in the vicinity of the discontinuity, making arc breakdown and glow discharge breakdown of the cooling gas more probable. With DC bias applied between an article and a chuck, and RF bias applied to the chuck, gas breakdown becomes probable with prior art electrostatic chucks such as described in U.S. Pat. Nos. 4,565,601 and 4,771,730.

In the '601 patent, a plurality of radial cooling gas dispersion grooves in an upper surface of a plate electrode connect to and extend outwardly from the relatively large upper end of a cooling gas supply pipe extending vertically to the upper surface of the plate electrode. Cooling gas from the supply pipe travels outwardly in the radial grooves and into a plurality circular gas dispersion grooves also formed in the upper surface of the plate electrode coaxial with the gas supply pipe. The upper surface of the plate electrode with the radial and circular patterns of grooves is covered with a thin insulating film upon which the article to be process is placed. The upper open end of the gas supply pipe forms a relatively large discontinuity in the upper surface of plate electrode. The radial and circular grooves are relatively wide and deep, slightly less than the diameter of the gas supply pipe, and form additional relatively wide and deep discontinuities in the upper surface to the plate electrode and relatively deep separation gaps between the plate electrode and the article to be processed. Further, irregularities in the coated surfaces of the grooves produce non-uniformities in gas flow and in the spacing of the article and the plate electrode. Undesired arc and glow discharge breakdowns of the cooling gas would occur if such an electrostatic chuck were employed in a high RF power, high density plasma reactor.

The same problems are particularly inherent in the electrostatic chuck of the '730 patent which includes a central and/or a plurality of relatively large gas feeding tubes to the upper surface of a plate electrode.

What is desired is an electrostatic chuck that can accommodate cooling gas between the workpiece and the chuck and which is designed to avoid gas breakdown even when the chuck is used in a plasma reactor environment including high RF bias power and high density plasma.

SUMMARY OF THE INVENTION

The E-chuck of the present invention is particularly useful in electrostatically holding an article to be processed, such as a semiconductor wafer, in a plasma reaction chamber while distributing a cooling gas between the face of the E-chuck and the underside of the article, without contributing to arc or glow discharge breakdown of the cooling gas.

The E-chuck comprises a metal pedestal having a smooth upper surface for electrostatically attracting and supporting the article. A smooth layer of a dielectric material is bonded to the upper surface of the pedestal.

One aspect of the present invention is that one or more conduits are formed inside the metal pedestal to permit cooling gas to be transported to one or more cavities just below the dielectric. A plurality of perforations which are much smaller in diameter than the conduits extend from the upper surface of the dielectric down to the cavities. These perforations provide a path for the cooling gas to flow from the cavities in the pedestal to the region between the dielectric layer and the semiconductor wafer or other workpiece. The invention permits the use of perforations which are much smaller in diameter than the smallest conduit that could be fabricated in the body of the metal pedestal. The use of such small perforations as the outlets for the cooling gas greatly increases the amount of RF bias power and plasma density to which the E-chuck can be exposed without causing breakdown of the cooling gas.

A second, independent aspect of the invention is that a cooling gas distribution channel is formed by one or more grooves in the upper surface of the dielectric layer for distributing a cooling gas between the upper surface of the dielectric layer and the underside of the article supported on the pedestal. According to this aspect of the invention, the depth of the grooves is small enough to maintain a low product of cooling gas pressure and groove depth so as to avoid glow discharge breakdown of the cooling gas, and the dielectric layer beneath the grooves is thick enough to prevent dielectric breakdown. In contrast with conventional E-chucks, the present invention locates the gas distribution channels in the layer of dielectric material rather than in the metal pedestal, thereby minimizing discontinuities in the electric field adjacent the pedestal which could contribute to arc or glow discharge breakdown of the cooling gas.

DETAILED DESCRIPTION OF THE PREFERRED EMBODIMENTS

Figure 1:
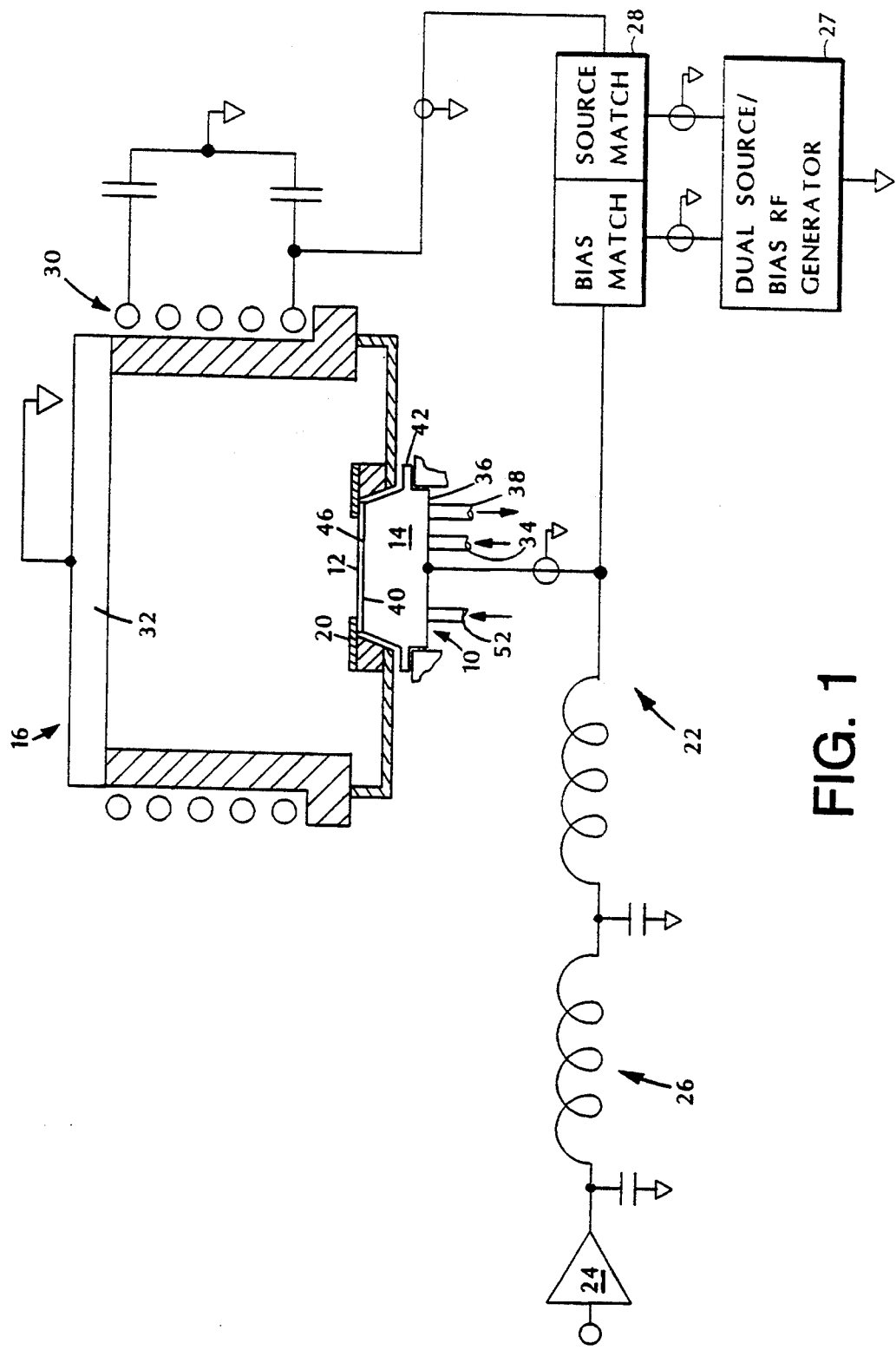
FIG. 1 is a schematic of the OMEGA biased high density plasma reaction chamber of Applied Materials, Inc. Santa Clara, Calif. illustrating the electrical circuitry therefor and including the E-chuck of the present invention to hold a semiconductor wafer on a pedestal of the E-chuck. The OMEGA reaction chamber (without a chuck) is described and illustrated in greater detail in the copending patent application Ser. No. 07/941,507, filed Sep. 8, 1992 for "Plasma Reactor Using Electromagnetic RF Coupling" and assigned to the same assignee as the present invention. The copending patent application is hereby incorporated by reference to complete the description of the OMEGA reaction chamber in which the E-chuck of the present invention is particularly useful.
Figure 2:
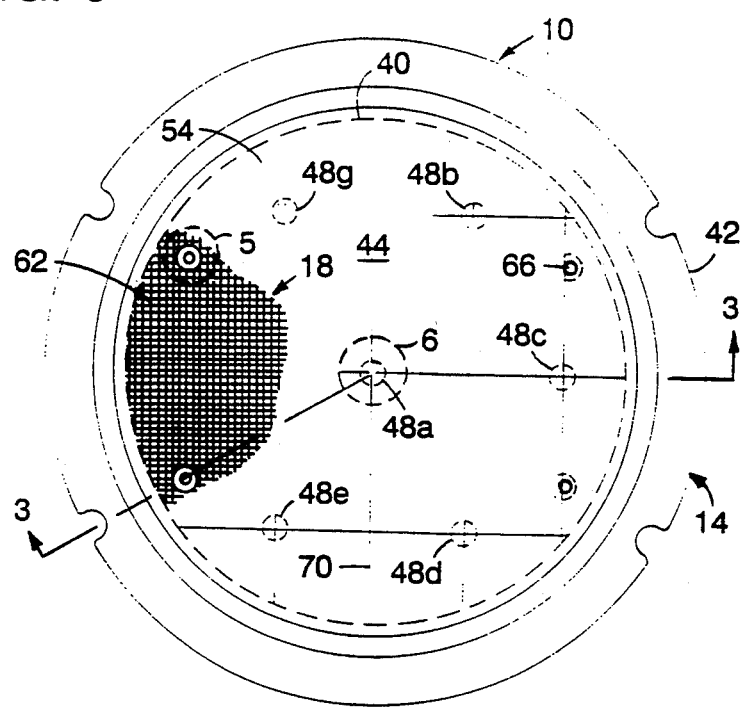
FIG. 2 is top view of a pedestal included in the E-chuck of the present invention and illustrates a gas distribution system formed in the upper surface of a layer of dielectric material bonded to the upper surface of the pedestal to distribute cooling gas over the surface of the layer from cooling gas receiving holes extending upwardly from an underside of the pedestal to upper ends adjacent the upper surface of the pedestal under the layer of dielectric material.

As shown in FIGS. 1 and 2, the E-chuck 10 of the present invention is adapted to support and electrostatically hold an article or workpiece 12 to be processed, such as a semiconductor wafer, on a pedestal 14 within a high density plasma reaction chamber 16. Through gas distribution grooves 18, the E-chuck 10 affects a cooling of the pedestal 14 and the wafer 12 supported thereon.

The plasma reaction chamber 16 further includes a cover ring 20 which is supported by four rods, not shown. The purpose of the cover ring is to prevent the plasma in the chamber above the workpiece from contacting, and thereby corroding, part of the E-chuck. Accordingly, the four rods position the cover ring within 0.01 inch of the edges of the workpiece and the E-chuck, a gap too small for the plasma to penetrate. The rods lift the cover away from the wafer and E-chuck when the wafer is being transported to or from the E-chuck.

For a more detailed understanding of the plasma reaction chamber 16 and its operation in processing the wafer 12, the reader should refer to the drawings and detailed description contained in the previously referred to patent application Ser. No. 07/941,507 incorporated by reference into this patent application.

As shown in FIG. 1, the electrical circuit for the plasma reaction chamber 16 is conventional. It includes a conventional DC voltage source 24 which supplies the clamping voltage which is coupled to the E-chuck 10 through a low pass filter 26 which isolates the DC voltage source 24 from the RF power supply 27. RF source power and RF bias power are each coupled from the conventional RF power supply 27 through a matching network 28, with the source power being coupled to an inductive antenna 30 and the bias power being coupled to the pedestal 14. A ground reference for both the RF bias power and DC voltage is a grounded top counter electrode 32. The DC voltage source 24 supplies −1000 volts for developing an electric field which electrostatically holds the wafer 12 to the pedestal 14. When it is desired to release (or "de-chuck") the wafer 12, the source 24 may be switched either to a zero output voltage or to a reverse polarity voltage if it is desired to accelerate the release of the wafer.

The plasma reaction chamber 16 employs inductively-coupled RF power to generate and maintain a high density, low energy plasma. RF bias power is capacitively coupled to the plasma via the wafer 12 and E-chuck 10, with the grounded counter electrode 32 located in the plasma source region providing a return path for bias current. With the configuration shown in FIG. 1, plasma density is controlled by the RF source power, and ion energy is independently controlled by the RF bias power. The result is a uniform high density, low electron temperature plasma at the wafer 12 with ion energy controllable from about 15 eV to several hundred eV. This configuration allows for etching of the wafer 12 with minimum charge up degradation and minimum energetic-particle damage.

While the above described plasma reaction chamber 16 provides a high oxide etch rate, it does impose some severe hardware requirements, particularly on the E-chuck 10. In particular, RF bias power must be uniformly coupled to the wafer 12 and to the plasma. With a high density, low electron temperature plasma, the cathode sheath is very thin, usually less one millimeter, and the impedance per unit area of the cathode sheath is primarily resistive and quite low. For wafers of typical resistivity, unless RF bias is very uniformly coupled to the wafer, ion/electron current and ion energy will not be uniform. In addition to the problem of uniform electrical coupling, tight uniform thermal coupling of the wafer 12 to the cooled E-chuck 10 is required. The heat load imposed on the wafer 12 is very large. For example, at a typical RF source power of 2800 watt and RF bias power of 1400 watt, approximately 2 KW of heat must removed continuously from the wafer.

Figure 2A:
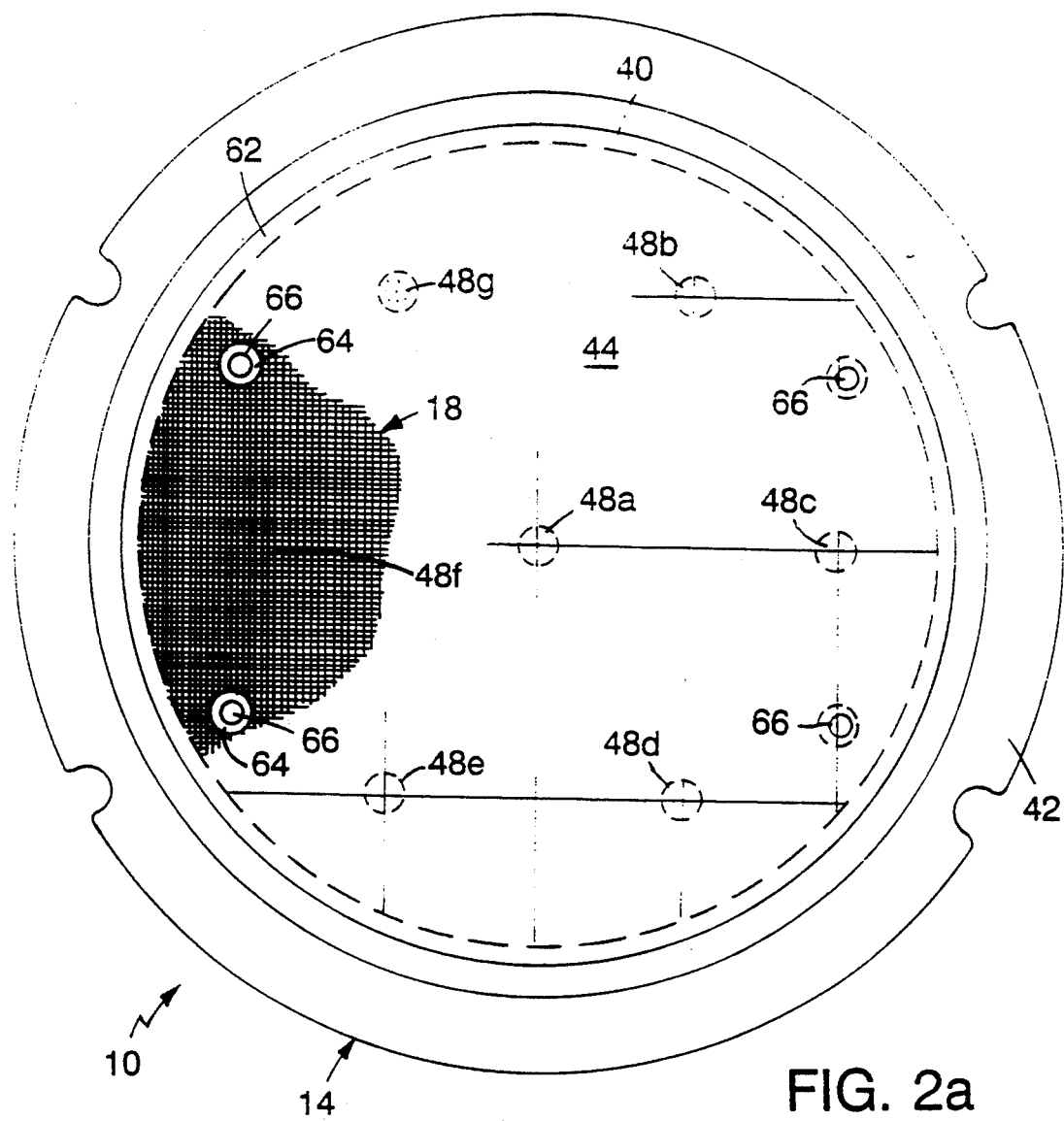
FIG. 2a is an enlarged showing of FIG. 2.
Figure 3A:
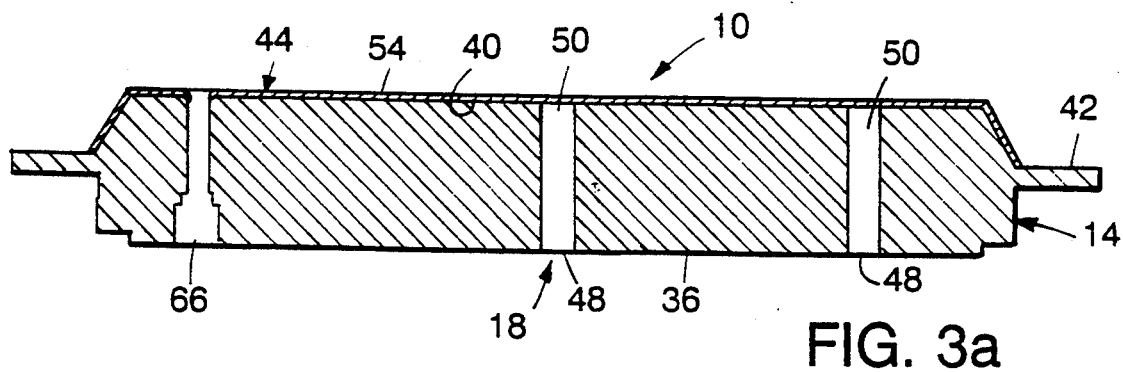
FIG. 3a is an enlarged version of FIG. 3.
Figure 6A:
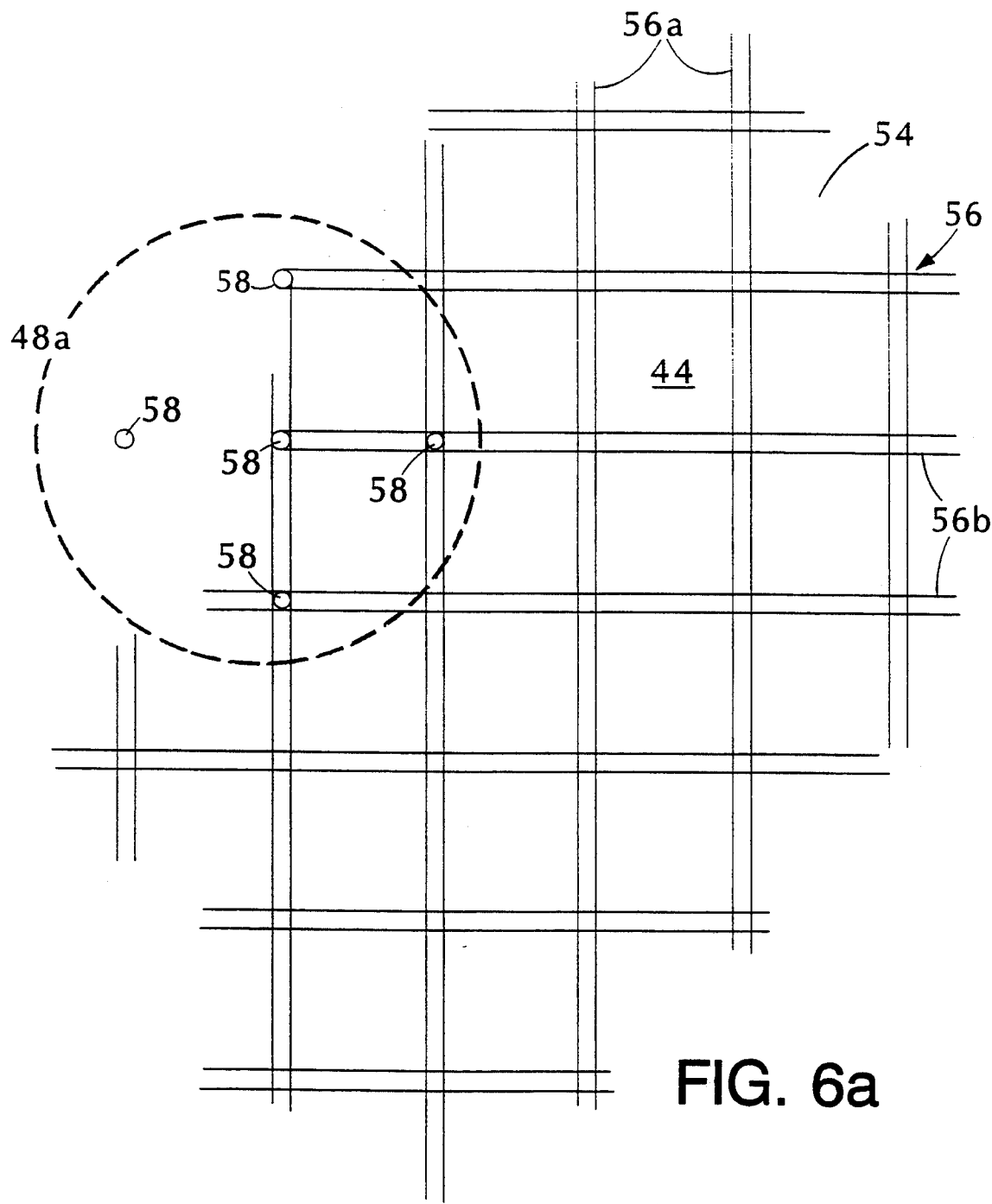
FIG. 6a is an enlarged showing of FIG. 6.

To provide for such uniform coupling and thermal cooling, the pedestal 14 in the E-chuck 10 of the present invention preferably comprises a one piece aluminum block with direct liquid cooling. Such liquid cooling is provided by cooling water entering an inlet 34 at an underside 36 of the pedestal 14 and traveling through cooling passages (not shown) to exit the pedestal through an outlet 38. More particularly, as illustrated in FIGS. 2 and 2a, the pedestal 14 comprises a short cylindrical block of aluminum having a flat upper surface 40 and flat underside 36 with an annular mounting flange 42 extending outwardly front an outer surface of the block comprising the pedestal. The voltage applied to the pedestal 14 by the DC voltage source 24, preferably about −1,000 volts, generates the electrostatic attractive force which holds the wafer 12 on the upper surface of the pedestal.

A smooth layer 44 of dielectric material is bonded to the smooth upper surface 40 of the pedestal 14 for contacting an under surface 46 of the wafer 12. The layer 44 of dielectric material uniformly covers the entire upper surface 40 of the pedestal 14, except over the four lift pin holes 66. Preferably the pedestal machined from an aluminum block which is finished to a smoothness and parallelism of less than 0.001 inch between the upper and lower faces 40 and 36, respectively. Holes are then bored in the pedestal as described below. The upper face 40 of the pedestal is bead blasted to improve adhesion, and then an approximately 0.020 inch thick ceramic dielectric layer 44 of alumina or an alumina/titania composite is then plasma-sprayed over the upper face 40 of the pedestal. The sprayed layer is then ground to achieve a dielectric coating thickness of about 0.010 inch with a smoothness of 0.5 microns.

A cooling gas, such as helium, is fed to the pedestal 14 through an inlet 52 and distributed into each of seven axially oriented gas conduits or cavities 48 within the pedestal. Each conduit is about 0.3 inch in diameter. One conduit 48a is at the center axis of the pedestal, and the other six conduits 48b-48g are spaced evenly around, and somewhat inward from, the periphery of the pedestal. Unlike conventional designs, the conduits do not penetrate the dielectric layer 44. In fact, the conduits preferably do not quite extend all the way to the upper surface of the pedestal 14, but instead leave a thin layer 60 of aluminum, preferably about 0.015 inch thick, above the upper end 50 of each conduit 48. Each conduit may be formed by counterboring a hole from the underside 36 of the pedestal block.

The cooling gas is transported from each conduit or cavity 48 to the surface 54 of the dielectric layer 44 via a plurality of perforations 58, each perforation being at least an order of magnitude smaller in diameter than the conduits 48. Preferably, laser drilling is used to create perforations of about 0.006 to 0.008 inch in diameter through the dielectric layer 44 and the thin layer 60 of aluminum overlying each conduit 48. Several such perforations are formed above the upper end 50 of each gas conduit or cavity 48.

To distribute the cooling gas from the perforations 58 over the upper face 54 of the dielectric layer 44, a pattern of one or more gas distribution grooves 18 is formed in the upper face 54. A single groove may intersect any number of the perforations, but each perforation communicates with at least one groove. The grooves should extend over most of the surface 54 of the dielectric so that, when a semiconductor substrate or other article 12 is placed on the E-chuck, the cooling gas will flow up through the conduits 48, through the perforations 58, through the distribution grooves 18, and into the microscopic interstitial spaces between the underside 46 of the substrate and the upper surface 54 of the dielectric layer.

Figure 6:
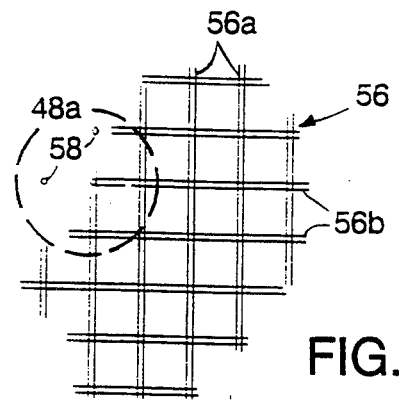
FIG. 6 is an enlarged showing of the portion of the pedestal within the circle 6 in FIG. 2 more clearly illustrating the intersecting nature of the grooves and gas distribution holes formed at the intersection of such grooves over a cooling gas receiving hole.
Figure 5:
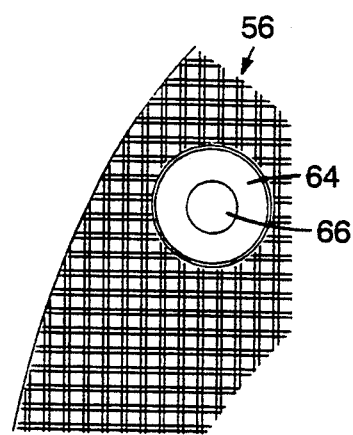
FIG. 5 is an enlarged showing of a portion of the pedestal within the circle 5 of FIG. 2 more clearly illustrating the intersecting nature of the grooves forming the gas distribution system, a lift pin hole having an annulus there around free of intersecting gas distributing grooves and a portion of an outer annulus bounding a central portion of the pedestal also free of intersecting gas distributing grooves.

In the preferred embodiment, the gas distribution grooves 18 are formed as a matrix of linear grooves in two orthogonal directions, as shown in FIGS. 5 and 6. Perforations 58 are provided where two orthogonal grooves intersect directly above a gas conduit 48, thereby permitted cooling gas to flow from the conduit, through the perforations, into the two intersecting grooves, and through these grooves to all grooves they intersect, and so on. The parallel grooves are spaced 0.1 inch apart, so that above each 0.3 inch diameter conduit 46 there are several groove intersections, each intersection being connected to the conduit via a perforation 58.

One consideration affecting the choice of groove spacing is that, to avoid any reduction in electrostatic clamping (or chucking) force between the E-chuck and the workpiece 12, the ratio of groove spacing to groove width should be large so that the gas distribution grooves do not occupy a significant fraction of the surface area 54 of the E-chuck. Another consideration, and a criterion that is much more difficult to satisfy, is that to achieve the best possible heat transfer between the workpiece and the E-chuck pedestal, the spacing between grooves should be no greater than roughly ten times the thickness of the workpiece, and more preferabley no greater than one-half the thickness. The thickness of a typical 8-inch silicon wafer is only 0.03 inch, but currently it is considered economically impractical to laser machine gas distribution grooves with a closer spacing than 0.1 inch.

Figure 4:
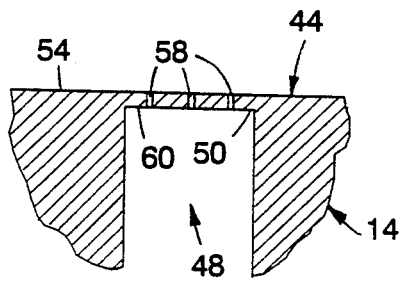
FIG. 4 is an enlarged illustration of the portion of the pedestal and layer of dielectric material within the circle 4 of FIG. 2 and shows the grooves defining the gas distribution system in the layer of dielectric material with gas distribution holes through intersections of the grooves and metal of the pedestal over the upper ends of the cooling gas receiving holes to define a cluster of gas distribution holes over each cooling gas receiving hole.
Figure 3:
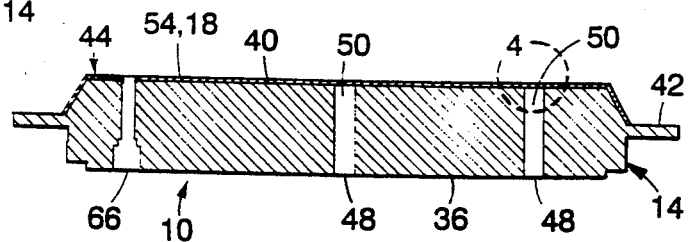
FIG. 3 is sectional side view along the lines 3—3 in FIG. 2 showing the internal construction of the pedestal and layer of dielectric material on the upper surface thereof with the cooling gas receiving holes extending vertically from an underside of the pedestal and a lift pin receiving hole for use in mechanically positioning and lifting the article being processed within the reaction chamber.

The grooves 18 are formed by laser machining the upper surface of the dielectric layer. Most of the grooves are 0.01 inch wide and 25 to 30 microns deep. These grooves are too small and dense to be shown clearly in FIGS. 2 and 2a, but they are represented by the dark, dense area at the left of each of these two figures. These grooves are clearly shown as the dark lines which form a matrix or crosshatch pattern in FIGS. 5 and 6, and they overlie the perforations 58 shown in FIG. 4. In addition, to further enhance gas distribution, above each of the conduits 48 is an orthogonal pair of larger grooves 70 which are illustrated in FIG. 2. These larger grooves are twice as wide and twice as deep as the other grooves.

An important feature of the present invention is that the E-chuck can be subjected to high power RF fields and high density plasmas immediately above the workpiece 12 without breakdown of the cooling gas due to arcing or glow discharge. One reason for this is that the top surface 40 of the pedestal is smooth, and the gas distribution grooves are formed in the dielectric layer rather than the metal pedestal. This minimizes discontinuities in the electric field above the E-chuck which otherwise could cause arcing. Another reason is that the groove depth is smaller than the sheath thickness of the plasma, so that a plasma cannot be sustained inside the groove, and it is small enough that the product of the groove depth and the cooling gas pressure is well below the value at which the cooling gas has a low glow discharge breakdown voltage according to the well known Paschen curve. Yet another reason is that the groove depth is shallow enough to leave a sufficiently thick dielectric layer beneath the groove to prevent breakdown of the dielectric.

Another, equally important feature of the invention which prevents breakdown of the cooling gas is the extremely small diameter (preferably about 0.007 inch) of the perforations 58 through which the cooling gas is transported to the surface 54 of the E-chuck. The small diameter of these holes minimizes discontinuities in the electric field which could cause breakdown of the cooling gas passing therethrough.

Figure 7:
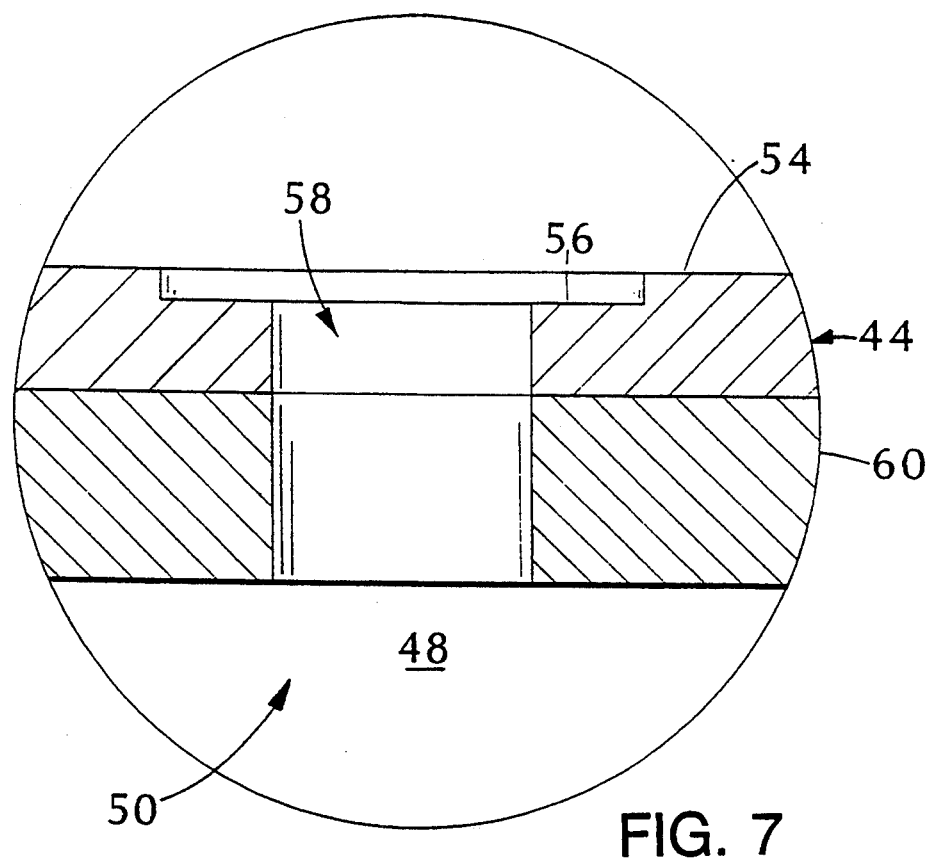
FIG. 7 is an enlarged showing of one form of gas distribution hole through the layer of dielectric material and the pedestal metal at the upper end of a cooling gas receiving hole.
Figure 8:
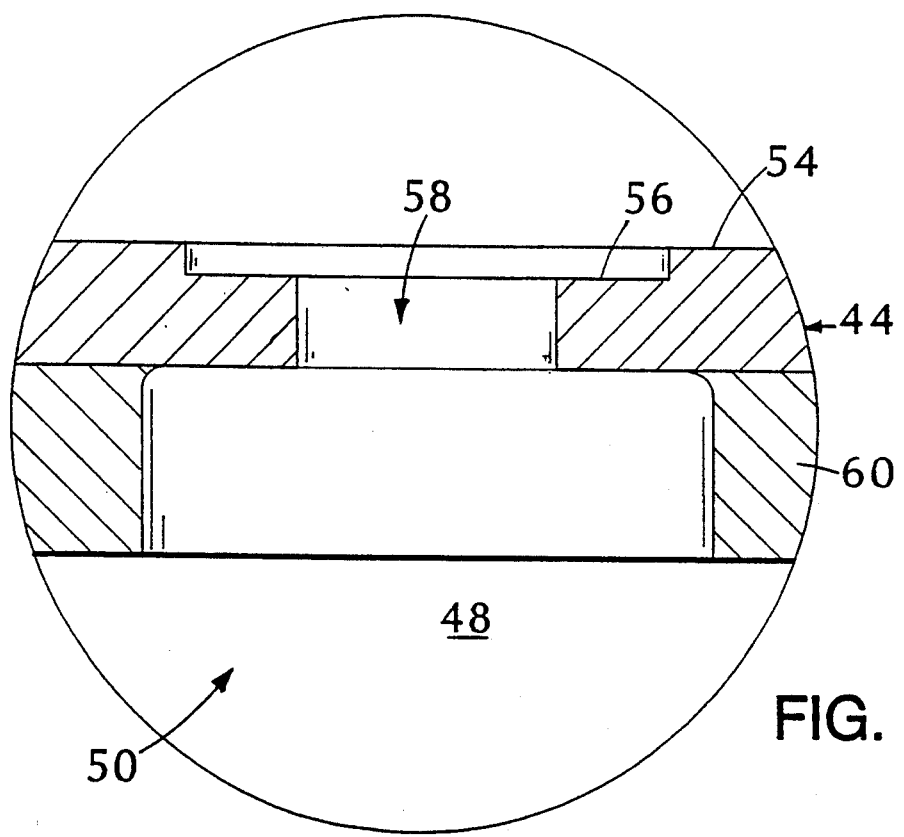
FIG. 8 is an enlarged showing of an alternate version of a gas distribution hole similar to that shown in FIG. 7.

Nevertheless, one shortcoming of the foregoing embodiment is that there is a line of sight path between the semiconductor substrate 12 above the perforation and the thin layer 60 of aluminum underlying the dielectric at the edge of the perforation, as shown in FIG. 7. Arcing could occur through this path, notwithstanding that the diameter of the perforation is otherwise small enough to avoid the previously discussed gas breakdown mechanisms. An alternative embodiment which avoids this problem employs laser machining to cut back the portion of the aluminum immediately adjacent the edge of each perforation 58, as shown in FIG. 8. This eliminates any line of sight path between the aluminum 60 and the substrate 12.

To facilitate robotic handling of the workpiece 12, four holes 66 for mechanical lift pins typically are provided in the pedestal. The lift pin holes generally are wide enough to cause gas breakdown problems if the cooling gas were permitted to enter the holes 66. To ensure the gas pressure inside the lift pin holes 66 is too low to undergo gas breakdown, the lift pins are connected to the same turbomolecular pump used to produce high vacuum (less than one Torr) in the plasma chamber 16. To seal the lift pin holes from the cooling gas, an annulus 64 between 0.125 to 0.200 inch wide in the dielectric layer is left smooth, without any gas distribution grooves. Since, as stated above, the dielectric is ground to a smoothness of 0.5 microns, when the clamping voltage 24 is applied the smooth underside of the semiconductor substrate 12 makes a gas tight seal against the annulus, thereby preventing cooling gas from entering the lift pin holes 66.

We claim:

1. An electrostatic chuck for holding and gas cooling a substrate during processing in a plasma reaction chamber, said chuck comprising:

a pedestal having a metallic upper surface; and a layer of dielectric material formed on the upper surface of said pedestal, said dielectric layer having a top surface for receiving a backside of said substrate when said substrate is placed on said chuck;

said pedestal having one or more internal cavities for distributing cooling gas, each of said one or more internal cavities being separated from said dielectric layer by an associated thin layer of pedestal material, wherein for each of said one or more internal cavities, said dielectric layer has one or more first holes passing therethrough, and the associated thin layer of pedestal material has an equal number of second holes passing therethrough and aligned with corresponding ones of said one or more first holes, wherein said first holes have first diameters and said second holes have second diameters that are larger than the first diameters of the corresponding first holes.

2. The electrostatic chuck of claim 1 wherein said second diameters are sufficiently larger than the corresponding first diameters so that for any given one of said one or more first holes no line of sight path exists from above said dielectric layer to the thin layer of pedestal material forming the second hole aligned therewith.

3. The electrostatic chuck of claim 2 wherein the dielectric layer has a network of cooling gas distribution grooves formed therein, at least some of the grooves of said network passing over said one or more first holes so as to supply cooling gas thereto.

4. The electrostatic chuck of claim 3 wherein the grooves of said network of gas distribution grooves penetrate said dielectric layer to a distance that is less than the thickness of the dielectric layer.

5. The electrostatic chuck of claim 2 wherein substrate has substantially uniform thickness and wherein the grooves of said network have a spacing that is within the range of about 0.5 to 10 times the thickness of the substrate.

6. The electrostatic chuck of claim 2 wherein the dielectric layer in which the network of distribution grooves is formed has a substantially uniform thickness and wherein the grooves of said network have a depth that is small relative to the thickness of the dielectric layer.

7. The electrostatic chuck of claim 5 wherein the grooves of said network have depths less than about 30 microns.

8. The electrostatic chuck of claim 1 wherein the layer of pedestal material separating the upper end of each of said internal cavities from said dielectric layer has a thickness of about 0.015 inch.

9. An electrostatic chuck for holding and gas cooling a substrate during processing in a plasma reaction chamber, said chuck comprising:

a pedestal having an upper surface; and a layer of dielectric material formed on the upper surface of said pedestal, said dielectric layer having a top surface for receiving a backside of said substrate when said substrate is placed on said chuck;

said pedestal having one or more internal cavities for distributing a cooling gas, each of said one or more internal cavities having an upper end that is adjacent to said dielectric layer, there being a layer of pedestal material separating each of said one or more cavities from said dielectric layer;

wherein for each of said one or more internal cavities, said dielectric layer has a plurality of first holes passing therethrough, and the associated thin layer of pedestal material has an equal number of second holes passing therethrough and aligned with corresponding ones of said plurality of first holes, wherein said first holes have a first diameter that is less than about 0.030 inch.

10. The electrostatic chuck of claim 9 wherein the first diameter lies within a range of about 0.005 to 0.020 inch.

11. The electrostatic chuck of claim 9 wherein the dielectric layer has a network of cooling gas distribution grooves formed therein, at least some of the grooves of said network passing over said one or more first holes so as to supply cooling gas thereto.

12. The electrostatic chuck of claim 11 wherein the grooves of said network of gas distribution grooves penetrate said dielectric layer to a distance that is less than the thickness of the dielectric layer.

13. An electrostatic chuck for holding and gas cooling a substrate during processing in a plasma reaction chamber, said chuck comprising:

a pedestal having a metallic upper surface; and a layer of dielectric material formed on the upper surface of said pedestal, said dielectric layer having a network of cooling gas distribution grooves formed therein, the grooves of said network of gas distribution grooves penetrating said dielectric layer to a distance that is less than the thickness of the dielectric layer and the upper surface of the pedestal beneath the network of grooves being smooth;

said pedestal having one or more internal cavities for distributing a cooling gas, each of said internal cavities having an upper end that is separated from said dielectric layer by a layer of pedestal material; there being for each of said internal cooling gas cavities, one or more perforations passing through said dielectric layer and the underlying layer of pedestal material and connecting that internal cooling gas cavity with one or more of the grooves of said network of gas distribution grooves.

14. The electrostatic chuck of claim 13 wherein for each of said one or more internal cavities, there are a plurality of perforations passing through said dielectric layer and the underlying layer of pedestal material and connecting that internal cooling gas cavity with one or more of the grooves of said network of gas distribution grooves.

15. The electrostatic chuck of claim 13 wherein there are a plurality of internal cavities.

16. The electrostatic chuck of claim 13 wherein said substrate has substantially uniform thickness and wherein the grooves of said network have a spacing that is within the range of about 0.5 to 10 times the thickness of the substrate.

17. The electrostatic chuck of claim 13 wherein the dielectric layer in which the network of distribution grooves is formed has a substantially uniform thickness and wherein the grooves of said network have a depth that is small relative to the thickness of the dielectric layer.

18. The electrostatic chuck of claim 17 wherein the grooves of said network have a depth that is less than about 30 microns.

19. The electrostatic chuck of claim 17 wherein the dielectric layer in which the network of distribution grooves is formed has a substantially uniform thickness of about 0.010 inch.

20. The electrostatic chuck of claim 13 wherein the grooves have widths that lie within a range of about 0.005 to 0.025 inch.

21. The electrostatic chuck of claim 13 wherein the spacing of the grooves lies within a range of about 0.020 to 0.250 inch center-to-center.

22. The electrostatic chuck of claim 13 wherein the perforations passing through the dielectric layer have a diameter that is in the range of about 0.005 to 0.020 inch.

23. The electrostatic chuck of claim 13 wherein the layer of pedestal material separating the upper end of each of said internal cavities from said dielectric layer has a thickness of about 0.015 inch.

24. The electrostatic chuck of claim 13 wherein the pedestal has an underside, wherein said network of cooling gas distribution grooves is a dense network of grooves covering most of a region of the top surface of the dielectric layer that coincides with the backside of the substrate when said substrate is being held on said electrostatic chuck, wherein the pedestal and the dielectric layer have a plurality of lift pin holes passing therethrough, said plurality of lift pin holes extending from the underside of said pedestal to the upper surface of said dielectric layer and providing passages through which lift pins can pass to lift the substrate off of the pedestal, said lift pin holes located within said region, and wherein a first annular area surrounds each of said plurality of lift pin holes, said top surface of said dielectric layer being smooth and free of grooves within said first annular rear so as to aid in forming a seal around each of said plurality of lift pin holes when said substrate is held on said electrostatic chuck during processing.

25. The electrostatic chuck of claim 24 wherein each of said first annular areas has a width that lies within a range of about 0.125 to 0.200 inch.

26. The electrostatic chuck of claim 13 wherein an second annular area surrounds the inside perimeter of said region, said top surface of said dielectric layer being smooth and free of grooves within said second annular area so as to aid in forming a seal around the outer perimeter of said substrate when said substrate is held on said electrostatic chuck during processing.

27. The electrostatic chuck of claim 26 wherein said second annular area has a width that lies within a range of about 0.050 to 0.250 inch.

28. An electrostatic chuck for holding and gas cooling a substrate during processing in a plasma reaction chamber, said chuck comprising:

a pedestal having a metallic upper surface and an underside; and a layer of dielectric material formed on the upper surface of said pedestal, said dielectric layer having a top surface and a dense network of cooling gas distribution grooves formed therein, said dense network of grooves covering most of a region of the top surface of the dielectric layer that coincides with the backside of the substrate when said substrate is being held on said electrostatic chuck, said pedestal including an internal cooling gas distribution network connected to said network of gas distribution grooves for distributing cooling gas thereto, said pedestal and dielectric layer having a plurality of lift pin holes passing therethrough, said plurality of lift pin holes extending from the underside of said pedestal to the upper surface of said dielectric layer and providing passages through which lift pins can pass to lift the substrate off of the pedestal, said lift pin holes located within said region, and wherein a first annular area surrounds each of said plurality of lift pin holes, said top surface of said dielectric layer being smooth and free of grooves within said first annular areas so as to aid in forming a seal around each of said plurality of lift pin holes when said substrate is held on said electrostatic chuck during processing.

29. The electrostatic chuck of claim 28 wherein each of said first annular areas has a width that lies within a range of about 0.125 to 0.200 inch.

30. The electrostatic chuck of claim 28 wherein substrate has substantially uniform thickness and wherein the grooves of said dense network of grooves have a spacing that is within the range of about 0.5 to 10 times the thickness of the substrate.

31. The electrostatic chuck of claim 28 wherein an second annular area surrounds the inside perimeter of said region, said top surface of said dielectric layer being smooth and free of grooves within said second annular area so as to aid in forming a seal around the outer perimeter of said substrate when said substrate is held on said electrostatic chuck during processing.

32. The electrostatic chuck of claim 31 wherein said second annular area has a width that lies within a range of about 0.050 to 0.250 inch.

* * * * *